United States Patent [19]

Muhlemann

[11] Patent Number: 5,212,474
[45] Date of Patent: May 18, 1993

[54] QUASI-STATIC LEVEL SHIFTER

[75] Inventor: Kurt Muhlemann, Zürich, Switzerland

[73] Assignee: U.S. Philips Corporation, New York, N.Y.

[21] Appl. No.: 694,581

[22] Filed: May 2, 1991

[30] Foreign Application Priority Data

May 7, 1990 [EP] European Pat. Off. ........ 90201157.6

[51] Int. Cl.$^5$ .......................... G09G 3/00; G09G 3/36
[52] U.S. Cl. .................................. 340/805; 340/784; 307/264; 307/268; 307/578
[58] Field of Search .............. 340/718, 776, 805, 784, 340/812; 368/242, 322, 156; 359/85; 307/445, 247.1, 495, 264, 263, 268, 419.1, 482, 578, 254

[56] References Cited

U.S. PATENT DOCUMENTS

| 4,064,405 | 12/1977 | Cricchi et al. | 307/451 |
| 4,362,955 | 12/1982 | Davenport | 307/264 |
| 4,384,287 | 5/1983 | Sakuma | 307/451 |
| 4,492,881 | 1/1985 | Anderson et al. | 307/254 |
| 4,533,839 | 8/1985 | Balakrishnan | 307/254 |
| 4,831,280 | 5/1989 | Caya et al. | 307/585 |

FOREIGN PATENT DOCUMENTS 201460 2/1989 Japan.

OTHER PUBLICATIONS

"A Thin-Film-Transistor-Controlled Liquid Crystal Numeric Display", by James C. Erskine, Paul A. Snopko, IEEE, vol. Ed. 26, No. 5, May, 79.

Primary Examiner—Alvin E. Oberley
Assistant Examiner—Amare Mengistu
Attorney, Agent, or Firm—Robert J. Kraus

[57] ABSTRACT

A quasi-static level shifter includes an output stage including a first transistor which is controlled directly by the input signal, and a further transistor connected in series with the first transistor to terminals of a DC supply voltage and which is controlled, via a capacitance, by the input signal combined with a recurrent, spike-shaped signal. The level shifter thus behaves as a static level shifter but has a lower current consumption and requires less surface area.

14 Claims, 2 Drawing Sheets

QUASI-STATIC LEVEL SHIFTER

BACKGROUND OF THE INVENTION

This invention relates to a level shifter comprising a charging path between a first supply voltage and an output, and a discharging path between the output and a second supply voltage, the paths being controllable in a mutually complementary fashion by an input signal on an input, one of the paths being DC coupled to the input while the other path is coupled thereto via a capacitance. The invention also comprising a driver circuit which includes such level shifters and to a display provided with such a driver circuit.

A level shifter of this kind is known per se. The operation of the known level shifter is fully dynamic, i.e. its output signal is not available in static form. Driving of further circuits by means of this output signal requires either a time-critical behaviour of these circuits or special steps to safeguard control of these circuits because at least one of the levels of this output signal is not stable. Therefore, it is an object of the invention to provide a level shifter of the kind set forth which does not have said drawbacks.

SUMMARY OF THE INVENTION

This object is achieved by a level shifter in accordance with the invention which is characterized in that in order to regenerate a control voltage on a control input of the other path, the input signal is logically combined with a recurrent signal which can be applied to the control input via the capacitance. The signal transferred via the capacitance to the gate electrode of an FET in the other path is then continuously regenerated by the recurrent signal. The logic combination of the recurrent signal with the input signal ensures that the level shifter behaves as a static level shifter at its output, i.e. both logic levels on the output are substantially constant.

In the context of the present Patent Application, a recurrent signal is to be understood to mean not only a periodic signal, i.e. a signal which recurs after a regular time interval, but also a signal which recurs after an irregular time interval and/or with a deviating waveform.

In comparison with static level shifters, the level shifter in accordance with the invention also requires less surface area. Moreover, the power consumption of the level shifter in accordance with the invention is substantially lower.

The level shifter is preferably used in a driver circuit for controlling the row-wise and column-wise arranged display elements of a display apparatus, for example, an LCD display. A plurality of level shifters can then be advantageously combined so that a number of components can be used in common in a number of level shifters. For example, a spike generator can then apply the same recurrent signal to several level shifters simultaneously. Such common use results in a substantial further reduction of the surface area required.

It is to be noted that the level shifter and driver circuits in accordance with the invention can be realised on a semiconductor substrate or also according to the so-called thin-film technique. In this respect reference is made to the article by J. C. Erskine and P. A. Snopko "A thin-film-transistor-controlled liquid-crystal numeric display", IEEE TED 26 (5), 1979, pp. 802–806. Thin-film integrated circuits can be advantageously used for display applications where the circuits are integrated in a thin film on a substrate, for example, a glass plate or a quartz plate. The substrate then forms part of the screen of the (LCD) display. It will be evident that a higher degree of system integration can thus be achieved.

BRIEF DESCRIPTION OF THE DRAWING

The invention will be described in detail hereinafter with reference to the accompanying drawing; in which.

DESCRIPTION OF THE PREFERRED EMBODIMENTS

Figure 1:
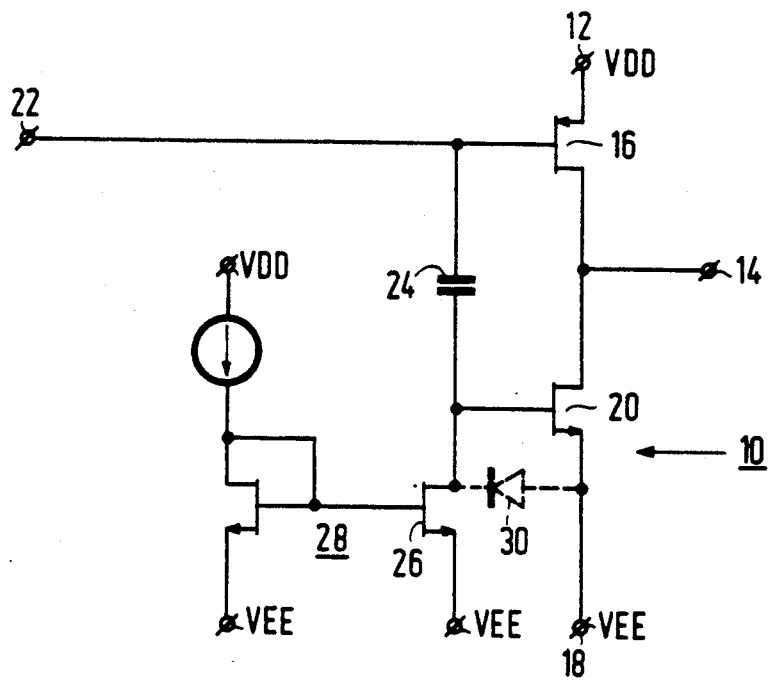
FIG. 1 shows an example of a dynamic level shifter.

FIG. 1 shows a dynamic level shifter 10 which is integrated on a semiconductor substrate in the present example. The level shifter 10 comprises a P-channel transistor 16 connected between a first supply terminal 12 and the output 14 and an N-channel transistor 20 connected between the output 14 and a second supply terminal 18. The supply voltage on the terminal 12 is, for example, 5 V and that on the terminal 18 is, for example, minus 30 V. The input 22 receives input signals whose level (for example, 0–5 V) is transformed by the level shifter 10. The input 22 is directly connected to the gate of the transistor 16 and the capacitance 24 provides a capacitive coupling between the input 22 and the gate of the transistor 20. There is also provided a control discharging path for the gate of the transistor 20 which in this case comprises the output branch 26 of a current mirror 28. The control discharging path ensures that an accumulation of charge on the gate of the transistor 20, caused by a positive signal transition on the input 22, flows to the terminal 18. On the other hand, the PN-junction 30, being inherent in a P-well technology, provides equalization in the case of a negative signal transition on the input 22. The control discharging path as well as said PN-junction prevent a floating potential on the gate. It is a drawback of this circuit that the lowest level of the output signal on the output 14 does not have a fixed value because the transistor 20 is turned on only during and briefly after a positive transition of the input signal. The circuits controlled by the output signal thus have to respond only briefly to the negative transition of the output signal or buffering is required at the input side.

Figure 2:
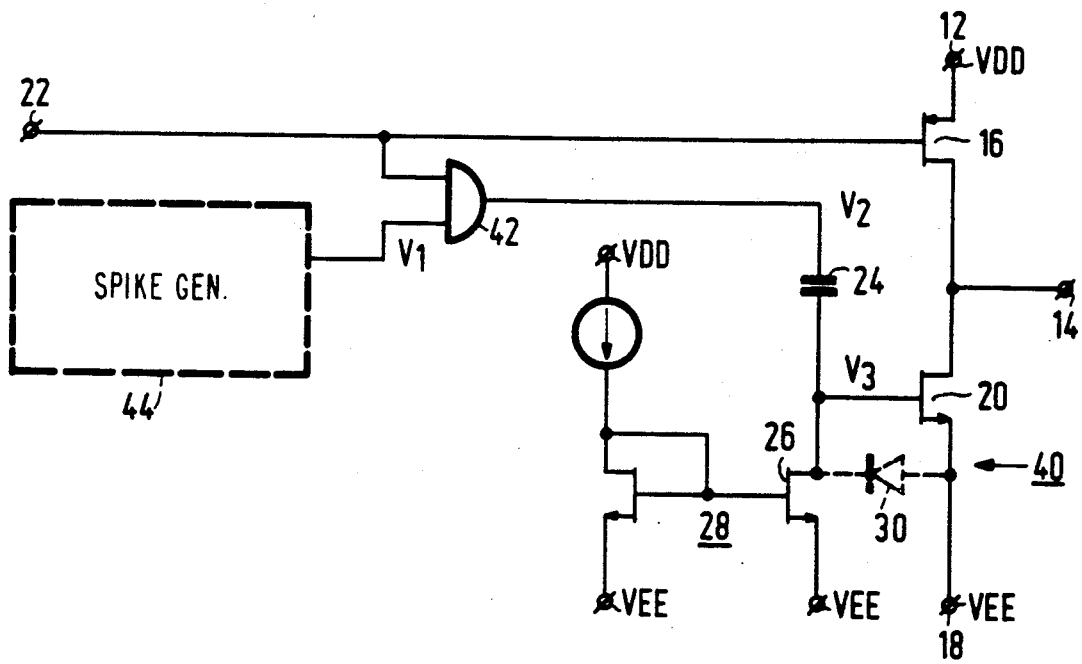
FIG. 2 shows an example of a level shifter in accordance with the invention.
Figure 3:
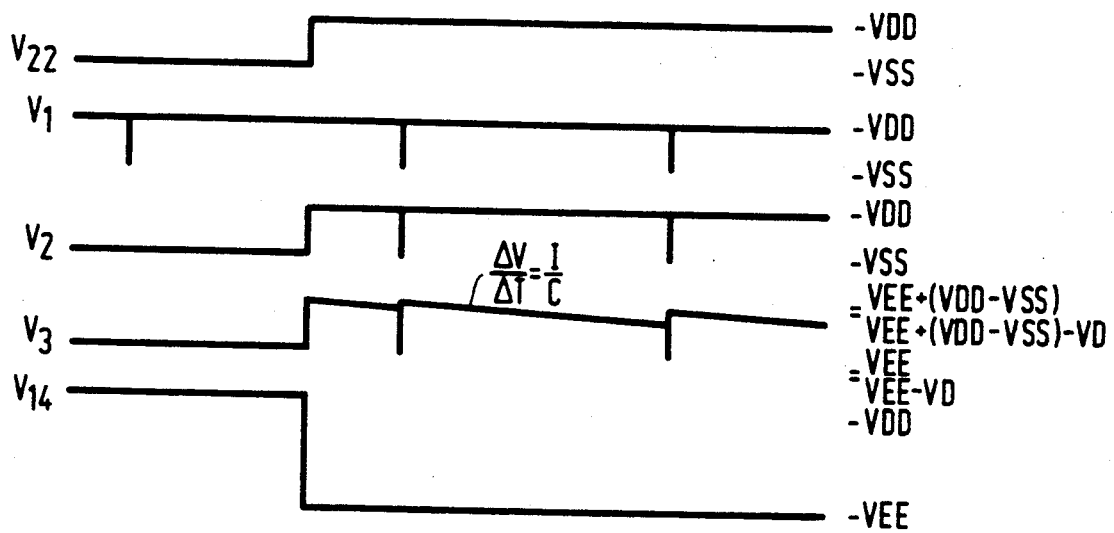
FIG. 3 shows the voltages at various points in the circuit shown in FIG. 2.

FIG. 2 shows an embodiment of a level shifter 40 in accordance with the invention which does not have said drawbacks. The reference numerals corresponding to those used in FIG. 1 denote similar or identical components. Instead of the direct capacitive coupling of the input 22 to the gate of the N-channel transistor 20, the input signal is first combined with a spike-shaped recurrent signal in the logic gate 42 whose input side is connected to the input 22 and to a spike generator 44. In the absence of the gate 42 and the spike generator 44, i.e. with the input terminal 22 directly connected to capacitor 24, the control voltage at the gate of FET 20 would change gradually due to the leakage of the electrical charge. This could then result in a variation in the output voltage at the output terminal 14 so that the logic state could be erroneously interpreted by the following circuit. According to the invention, the control voltage at the gate of FET 20 is refreshed by logically combining the input signal with the recurrent signal and supplying the combination signal to the control input of FET 20 via the capacitor 24. In effect, the input signal at terminal 22 functions as an enabling signal for the transmission of the recurrent signal to the capacitor. The signals present at various points in the circuit are shown in FIG. 3. The upper line $V_{22}$ represents the input signal on the input 22. The second line $V_1$ represents the spike-shaped recurrent output signal of the spike generator 44. The line $V_2$ therebelow represents the signal combined in the logic gate 42 and which is supplied to the capacitance 24. $V_3$ represents the signal filtered by the capacitance 24 and present on the gate of the transistor 20, and the line $V_{14}$ represents the output signal of the level shifter at the output 14. As a result of the combination operation, the voltage on the gate of the transistor 20 is periodically regenerated. This means that the logic high level of this voltage remains defined within a given range and hence also the low level of the output signal $V_{14}$. The input signal $V_{22}$ varies between $V_{DD}$ and $V_{SS}$, whereas the range of the output signal $V_{14}$ lies between $V_{DD}$ and $V_{EE}$. The output range is greater than the input range.

Instead of a spike-shaped signal, a signal having an arbitrary waveform can be used when this signal is recurrently applied to the logic gate 42 during a short period of time. In either case, when the signal voltage $V_{22}$ switches from the voltage level $V_{SS}$ to $V_{DD}$, transistor 16 is turned off. At the same time, the AND gate 42 is enabled and transmits the spike voltage $V_1$, superimposed on the voltage $V_{22}$, to the capacitor 24. The capacitor functions as a short circuit for the high frequency spike-shaped signal $V_1$ so that the negative going spike is applied to the gate of transistor 20, where it is added to the voltage already present at the gate. For a brief instant, the sum of the voltages may be lower than the voltage $V_{EE}$ so that diode 30 conducts, whereupon electric charge is supplied to the gate of FET 20. When the spike voltage disappears, the charge will remain at the gate so as to produce a higher voltage than was present prior to the occurrence of the spike. This charge will gradually leak away via transistor 26 causing the gate voltage $V_3$ to gradually decrease until it is refreshed by the next spike voltage. So long as the spike voltages reappear before the gate voltage drops below a given limit value, the output voltage $V_{14}$ of the level shifter circuit will remain stable.

Figure 4:
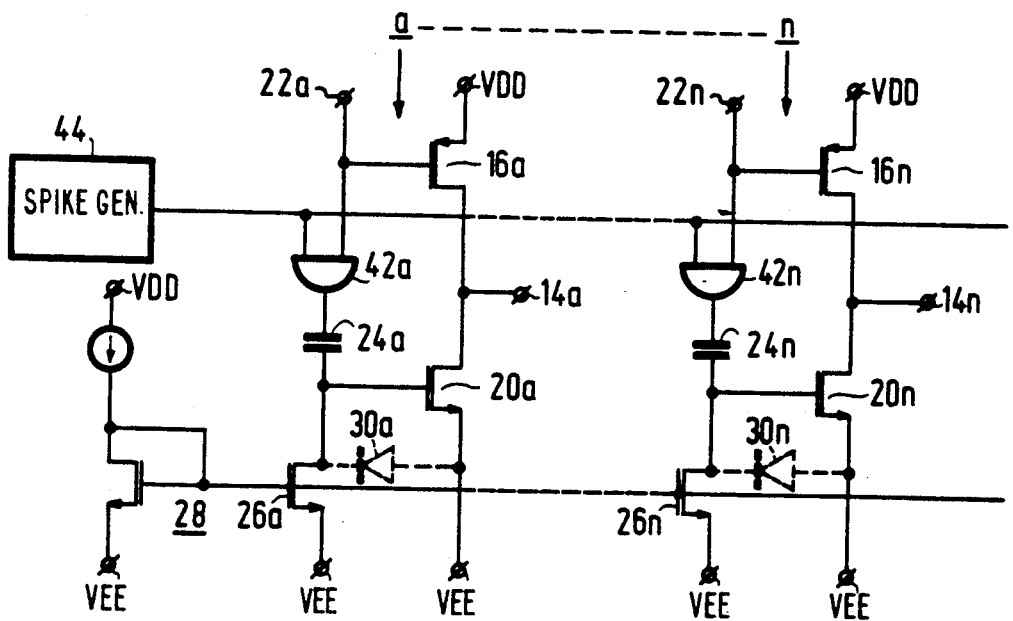
FIG. 4 shows an array of level shifters in accordance with the invention which use parts in common.

FIG. 4 shows an embodiment comprising a plurality of n level shifters in accordance with the invention, the spike generator 44 as well as the input branch of the current mirror 28 being shared by a plurality of level shifters a . . . n. This embodiment offers the advantage that the surface area required and also the current consumption are reduced. In this Figure each of the elements of the level shifters a . . . n is denoted by the same reference numeral as used in FIG. 2, supplemented by one of the letters a . . . n.

It is to be noted that the described embodiments relate to combined control of the N-channel transistor. A similar arrangement in the complementary case, i.e. in the case of capacitive control of the P-channel transistor, can be controlled in a similar manner.

It is also to be noted that the same principle can also be used, for example, in the case of a push-pull stage consisting of two N-channel transistors.

Finally, it is to be noted that instead of a current mirror as used in the above preferred embodiment, other control input discharging paths can be used, such as a diode, for example, a high-ohmic poly-diode, a resistor, a parallel connection of a resistor and a diode.

I claim:

1. A level shifter comprising:
   an input terminal and an output terminal,
   a charge path including a first transistor and coupled between a first supply voltage terminal and the output terminal,
   a discharge path including a second transistor and coupled between the output terminal and a second supply voltage terminal,
   means for DC coupling an input signal at the input terminal to a control electrode of the first transistor,
   means for generating a recurrent signal,
   means coupled to said input terminal and to an output of the signal generating means for logically combining the input signal applied to the input terminal with said recurrent signal, and
   a capacitor for coupling an output signal of the combining means to a control input of the second transistor thereby to regenerate a control voltage developed at said control input of the second transistor, and wherein
   said input signal and said output signal control said first and second transistors to switch in a mutually complementary manner.

2. A level shifter as claimed in claim 1, wherein the signal generating means comprises a spike generator for generating the recurrent pulse signal and the combining means comprises a logic gate for combining the pulse signal with the input signal.

3. A level shifter as claimed in claim 1 further, comprising an output branch of a current mirror connected in a further discharge path for the control input which extends between the control input and the second supply voltage terminal.

4. A driver circuit comprising at least one level shifter as claimed in claim 1, 2 or 3.

5. A driver circuit as claimed in claim 4, comprising a plurality of level shifters, at least one of the following components being used in common for said plurality of level shifters;
   a spike generator for generating the recurrent signal;
   an input branch of a current mirror, a respective output branch of which is connected in a further discharge path between a respective control input and the second supply voltage.

6. A driver circuit as claimed in claim 5 which is integrated on a semiconductor substrate.

7. A display apparatus comprising a matrix of picture elements which are arranged in rows and columns and provided with a driver circuit as claimed in claim 5 for controlling at least the rows or the columns of picture elements.

8. A display apparatus as claimed in claim 7 provided on a glass plate or quartz plate substrate, the driver circuit being integrated at least partly on the substrate.

9. A level shift circuit comprising:
   an input terminal for receiving an input signal,
   an output terminal for deriving an output signal,
   first and second DC supply voltage terminals,
   first and second opposite conductivity transistors connected serially between said first and second DC supply voltage terminals and with a common junction point therebetween coupled to said output terminal, means for generating a recurrent signal, a combination circuit having first and second inputs coupled to said input terminal and to an output of the signal generating means, respectively, thereby to combine said input signal and said recurrent signal, a capacitor for coupling an output of the combination circuit to a control input of the second transistor thereby to regenerate a control voltage developed at said control input of the second transistor, and means for DC coupling the input terminal to a control input of the first transistor so that said first and second transistors are switched on and off in a mutually complementary manner.

10. A level shift circuit as claimed in claim 9 wherein said input signal is a binary level voltage having a first given voltage range and said output signal is a binary voltage having a second voltage range that is greater than the first given voltage range.

11. A level shift circuit as claimed in claim 9 further comprising a current mirror circuit having an input branch coupled to a current source and an output branch coupled to the control input of the second transistor.

12. A level shift circuit as claimed in claim 9 wherein said signal generating means produces a periodic signal of short duration relative to said input signal.

13. A driver circuit comprising at least first and second level shift circuits each as claimed in claim 9 wherein each combination circuit has its first input coupled to its respective input terminal and its second input coupled in common to a common signal generating means.

14. A driver circuit as claimed in claim 13 further comprising a common current mirror circuit having an input branch coupled to a current source and individual output branches coupled to respective control inputs of respective second transistors of the first and second level shift circuits.

* * * * *